United States Patent [19]

Comstock

[11] 4,222,007
[45] Sep. 9, 1980

[54] APPARATUS FOR DETECTING AND MEASURING AN ELECTROSTATIC FIELD

[75] Inventor: Bluford M. Comstock, Boulder, Colo.

[73] Assignee: Scientific Enterprises, Inc., Broomfield, Colo.

[21] Appl. No.: 963,317

[22] Filed: Nov. 24, 1978

[51] Int. Cl.² .............................................. G01R 5/28
[52] U.S. Cl. .................................................. 324/458
[58] Field of Search ............................... 324/457, 458

[56] References Cited

U.S. PATENT DOCUMENTS

| | | | |
|---|---|---|---|
| 2,993,165 | 7/1961 | Jauch | 324/458 |
| 4,055,798 | 10/1977 | Kato | 324/458 |

*Primary Examiner*—Michael J. Tokar
*Attorney, Agent, or Firm*—Ancel W. Lewis, Jr.

[57] ABSTRACT

Apparatus for detecting and measuring an electrostatic field is disclosed which includes two sensing plates and a rotary blade that is rotated to move over the sensing plates to vary the amount of area of each of the sensing plates exposed to an electrostatic field being measured. A particular width and a particular arrangement of the sensing plates are used for producing a non-symmetrical electric output signal with a repetitive wave-form having a reversal of the peaks in each half-cycle. The dissymmetry of the peaks indicates field polarity information and the amplitude indicates field intensity information. Each sensing plate has a non-linear varying width that decreases from a wide end to a narrower end to develop distinctive characteristics in the wave-form. A resistor is connected across the sensing plates, the resistor having a center tap on the resistor that is connected to ground and the voltage signal across the resistor resulting from a field on the sensing plates is applied as an input signal from the difference amplifier producing an output signal that is a measure of the polarity and intensity of the electrostatic field. The output signal is applicable to a variety of indicator devices including digital voltmeters, lamps, buzzers, and microprocessor units.

22 Claims, 12 Drawing Figures

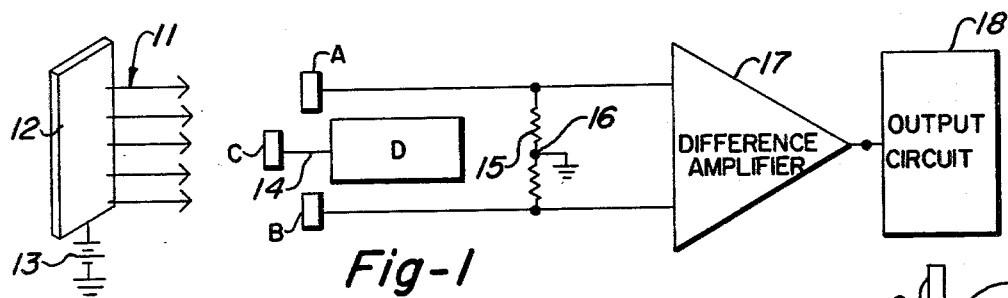
Fig-1
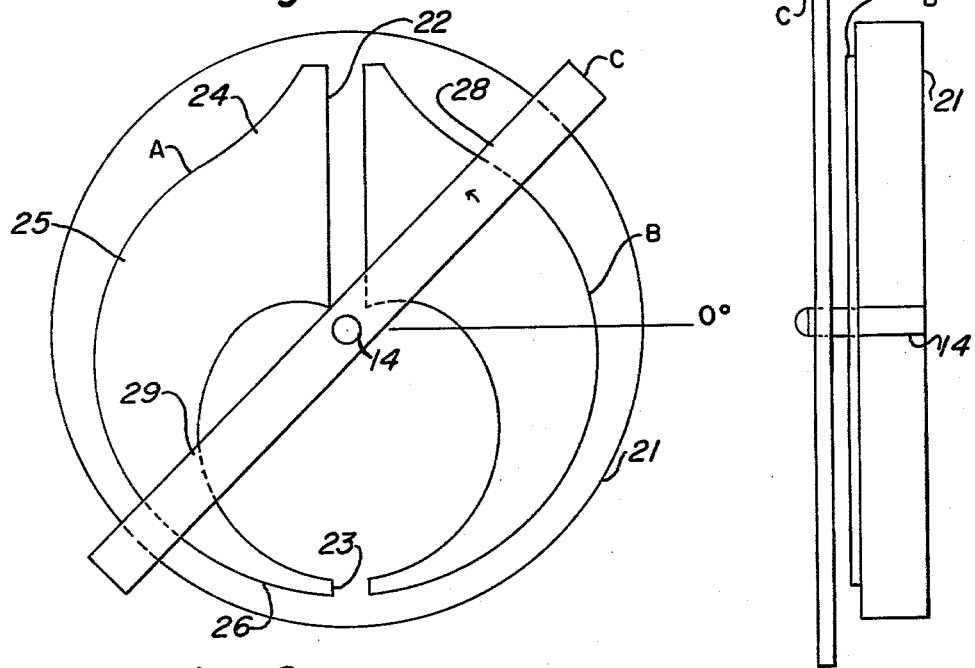
Fig-2
Fig-3
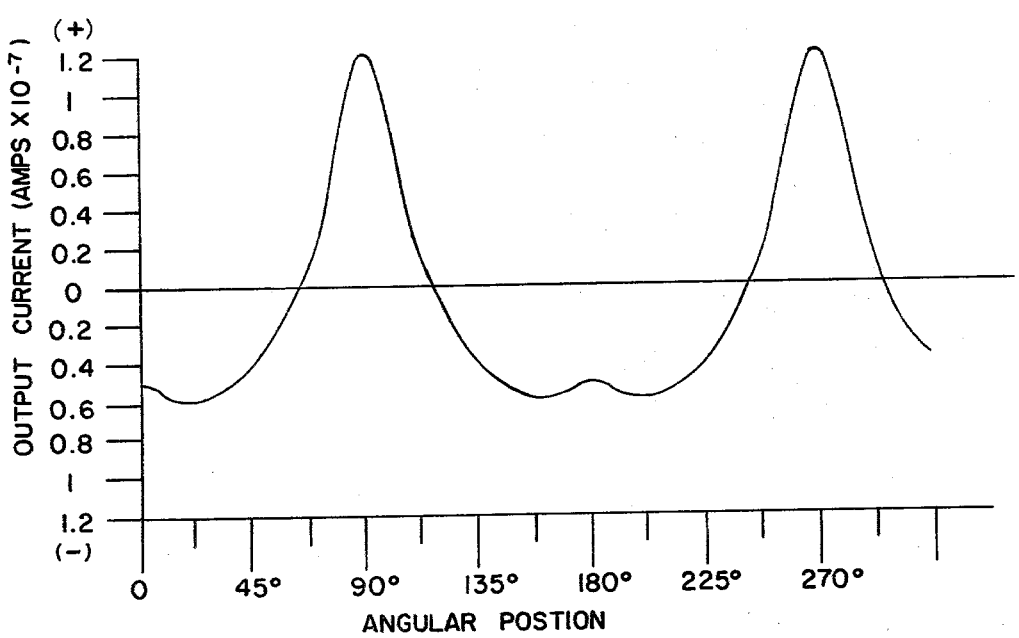
Fig-5

APPARATUS FOR DETECTING AND MEASURING AN ELECTROSTATIC FIELD

FIELD OF THE INVENTION

This invention relates to novel and improved apparatus for detecting and measuring an eletrostatic field.

BACKGROUND OF THE INVENTION

There are a number of applications requiring the detection of and information on an electrostatic field, as for example in a plant where two materials are rubbing against one another. Attempts have heretofore been made to provide apparatus suitable for this purpose but in general the principal areas of deficiency of such apparatus include insensitivity, instability, inaccuracy, and a lack of sufficient measurement information.

The most commonly known apparatus for measuring electrostatic fields include the use of an ion drift chamber and the use of a mechanical modulator. Both of these prior known approaches have uncertainty problems, but it has been found that the mechanical modulator type can be controlled to give reasonably good accuracy and stability.

The apparatus of the present invention in general is in the category of a mechanical modulator. All mechanical modulator-type apparatus for detecting electrostatic fields has the electrostatic field being measured passed through a slotted disc or rotary chopper blade and this field is interrupted as ground segments and open segments alternately pass in front of one or more sensing plates. The one or more sensing plates which are mounted behind the disc or chopper produce an electric signal output when the electrostatic field falls on them and a reverse electric output signal when the field is interrupted by the disc or chopper. The intensity of the field is related to the amplitude of the output signal and the polarity of the field is indicated by the phase of the output signal.

The output signal is symmetrical and must be phase demodulated to obtain information about the strength polarity and potential of the electrostatic field being measured. Phase demodulation requires careful timing and therefore an extra detector is added to determine the position of the rotary blade in its rotation. In nearly all of the mechanical modulator-type apparatus a capacitor coupling is used between the charge to be detected and the detector, and through some mechanical means this coupling is modulated.

In these prior known types of apparatus the impedance between the case and ground is of very unpredictable magnitude and the effect of this impedance must be eliminated if accuracy is to be achieved. This has been done in the past by using a differential sensor arrangement.

Accordingly, it is an object of the present invention to provide a novel and improved comparatively simple apparatus for detecting and measuring electrostatic fields.

Another object of this invention is to provide a novel apparatus for measuring electrostatic fields characterized by accuracy, stability and the development of useful information regarding the polarity of the electrostatic field.

Still another object of this invention is to provide a novel measuring apparatus for electrostatic fields which does not have the effects of stray capacitance between the case and ground, and does not require synchronous rectification to obtain polarity and intensity data about the field.

Yet a further object of this invention is to provide a novel and improved apparatus for detecting and measuring electrostatic fields characterized by the use of at least two sensing plates, each of which forms one plate of a capacitor with the surface area producing the field being measured, and a rotary field-interrupting blade whereby the plate area, and thereby the capacitances of the two capacitors, vary inversely over a full cycle of operation with a reversal in each half-cycle to provide an instantaneous current in the plate for producing a non-symmetrical output signal that is a measure of the polarity and intensity of the electrostatic field exposed to the sensing plates.

SUMMARY OF THE INVENTION

Electrostatic field detecting and measuring apparatus includes at least two sensing plates of a selected shape and arrangement characterized by a particular width configuration, each of which forms one plate of a capacitor with the other plate being a charged surface area producing an electrostatic field being measured. A rotary blade is arranged whereby, upon rotation of the blade over the sensing plates, the charge on the capacitors varies in an inverse relationship for each cycle with a reversal of peak position in each half-cycle, thereby generating an instantaneous current in each capacitor which, when passed through a load resistor and applied to a difference amplifier, provides a non-symmetrical output signal that is a measure of polarity and intensity of the electrostatic field exposed to the sensing plates. In one form disclosed there are two sensing plates and in another form there are two sensing plates each with two diametrically opposed plate segments. A variety of indicator devices are used to indicate the measured polarity and intensity.

Other objects, advantages and capabilities of the present invention will become more apparent as the description proceeds, taken in conjunction with the accompanying drawings in which like parts have similar reference numerals and in which:

FIG. 1 is a schematic diagram of apparatus for detecting and measuring an electrostatic field according to the present invention;

FIG. 2 is a side elevation view of a sensor including two sensing plates and a rotary blade;

FIG. 3 is an end elevation view of the sensor shown in FIG. 2;

FIG. 5 is a wave-form showing the output current in relation to the angular position of the blade shown in FIG. 2;

Figure 4:
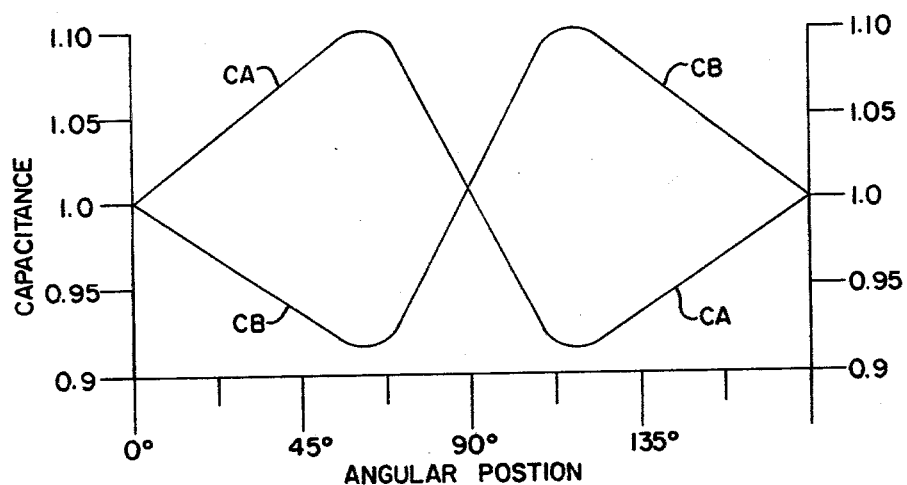
FIG. 4 is a diagram showing the change in capacitance between each of the two sensing plates and the charged surface area producing the field being measured in relation to the angular position of the blade shown in FIG. 2.

Referring now to FIG. 1, there is represented an electrostatic field designated by numeral 11 provided by a charged surface area 12 illustrated as a flat plate having a surface area of a selective dimension connected to the positive electrode of a DC battery 13 with the other electrode of the battery being connected to ground.

The apparatus of the present invention, as illustrated in FIG. 1, basically includes a sensor with two conductive sensing plates A and B and a conductive rotary blade C with the blade C being rotated via a shaft 14 about an axis by a constant speed drive motor D and arranged relative to the sensing plates to vary the amount of the area of the sensing plates that is exposed to the electrostatic field 11 as the blade B is rotated.

A load resistor 15 is connected across the sensing plates A and B with the center of this resistor indicated at 16 being connected to ground. An output electric signal produced across the resistor 15 as a result of current flow produced in plates A and B is applied to the input terminals of a difference amplifier 17, and the output signal from the difference amplifier is shown as applied to an output circuit 18 which gives an indication of the measured polarity and intensity of the electrostatic field.

Briefly, the exposure of the sensing plates A and B to the electrostatic field 11 together with the rotation of the blade C causes an instantaneous electric current to flow in plates A and B and through resistor 16, providing an electric output signal across this resistor that is applied to the input of the difference amplifier 17. The difference amplifier 17 takes the difference between the two signals that appear across the two halves of the resistor 16 and produces an output signal that is a measure of the polarity and intensity of the electrostatic field which in turn is applied to the output circuit 18 which will indicate that measure.

Referring now to FIGS. 2 and 3, the two sensing plates are shown electrically insulated from one another and preferably in manufacturing are mounted on one flat face of a common dielectric substrate 21 so that the plates A and B are coplanar. A preferred substrate 21 is made of a very good insulator such as glass. These sensing plates A and B are symmetrical with respect to a line separating the plates and are of a corresponding size and shape. The sensing plates A and B further have a shape that varies in width along its length with a wide end 22 and a narrow end 23, and two plates are arranged end-to-end with their longitudinal center lines extending along a curve having a common center.

The plates are arranged with the wider ends adjacent and opposite one another and the narrower ends opposite and adjacent one another so that, following the curve of the center lines of these plates through a full circle of 360°, there is a plate shape and area that proceeds first from narrow to wide and then conversely from wide to narrow. More specifically, for each sensing plate there is a wide end 22, a tapered wide end portion 24, an intermediate portion 25 of uniform width, and a tapered narrow end portion 26 that terminates in narrow end 23. The corresponding shapes of the plates and reverse end-to-end arrangement shown for the sensing plates provides an inverse relationship between the amount of capacitance developed between each respective sensing plate and the charged surface area 12, as described more fully hereinafter.

The rotary blade C mounted on a shaft 14 between the two sensing plates on a separating line serves to cover and thereby shield different segments of the total area of each sensing plate as the blade is rotated. The axis of rotation for the blade C is offset from the common center for the curves through the center lines of the sensing plates.

With respect to its rotation in a counterclockwise direction, the blade C is further characterized as having a leading half portion 28 on one side of its axis of rotation that in its rotation passes from the narrower end to the wider end of sensing plate B and then from the wider end to the narrower end of the sensing plate A, while at the same time a trailing half portion 29 of the blade on the opposite side of its axis of rotation passes from the wider end to the narrower end of plate A and then from the narrower end to the wider end of plate B during each revolution of the blade C. For reference purposes the 0° reference point for the blade C is taken along the axis of an X-Y coordinate system and in this position the blade covers equal surface area segments of the two sensing plates A and B.

The shape and arrangement of plates A and B is such as to provide certain electric capacitance characteristics in the presence of an electrostatic field and these electric capacitance characteristics connected in a circuit as hereinafter described in turn establish the desired shape in the wave-form of an electric output signal. The capacitance characteristics are illustrated in FIG. 4 and the output current wave-form through each capacitor in FIG. 5.

The operation of the sensor is based on the principle that $E=Q/C$ where C is the capacitance between a sensing plate and the charge surface area 12. A capacitance designated CA is between sensing plate A and the charged surface area 12 and a capacitance designated CB between the other sensing plate B and the surface area 12. The capacitance is given by the equation $C=A\times(K/d)$ where A is the exposed area of the respective sensing plates in meters squared, C is the capacitance in farads, d is the distance between the charged surface area and sensing plates in meters, and K is the dielectric constant between the charged surface area and the sensing plates. Rotation of the blade C alternately exposes and covers the sensing plates A and B and causes these two capacitances to vary.

The way in which the capacitances vary relative to the rotation of the blade C is dependent entirely upon the shape of the sensing plates and, for the shapes shown, generally stated the capacitances vary inversely such that as one increases the other decreases.

Beginning at the 0° reference, the trailing half portion 29 of the blade covers an intermediate portion of plate A and the leading half portion 28 of the blade covers an intermediate portion of plate B with equal surface areas covered so that the exposed areas of plates A and B are equal, and this is assigned a capacitance value of 1.0 on the diagram in FIG. 4. As the blade C proceeds through an angular movement of 45°, less of plate B is exposed and more of plate A is exposed. At an angular rotation past 45° there is a reversal with an abrupt decrease in CA and increase in CB so that at an angular rotation of 90° equal areas of plate A and plate B are exposed and again CA and CB are equal.

As the blade proceeds past an angular rotation of 90° the leading half portion 28 of the blade covers a maximum segment of plate A and CA has a sharp decrease, while at the same time the trailing half portion 29 of the blade C covers the narrowest segment of plate B for a minimum coverage and a maximum capacitance CB. At an angular rotation past 125° the exposed surface area of plate A gradually increases to increase CA and conversely the exposed surface area of plate B gradually decreases to decrease CB at the same rate. At the end of an angular rotation of 180° the trailing half portion 29 becomes the leading half portion and the capacitances vary in the same manner between an angular rotation of 180° and 360°.

From the equation $E=Q/C$ we derive $E=\Delta Q/\Delta C$. E is the electric potential represented by battery 13 that produces the electrostatic field. Since C is the same every revolution and the charge Q is proportional to E, then the charge Q is in coulombs, C in farads and E in volts. The charge given up by the one capacitor equals the charge taken up by the other capacitor and no charge flows to ground. The two-plate arrangement thus eliminates the effects of the ground circuit and it will, when used with a balanced amplifier, reject interference from fields not modulated by the rotary blade. By using the single relationship of $\Delta Q/\Delta t=$ instantaneous current i, the time is the time it takes to rotate the blade from a small angle, say from 79° to 101°. Then we find:

$$E = \frac{\frac{\Delta Q}{\Delta t}}{\frac{\Delta C}{\Delta t}} = \frac{i}{\frac{\Delta C}{\Delta t}} = \frac{i}{constant}$$

Therefore, for a given configuration of plates A and B and fixed motor speed, the output current i will be proportional to the source of voltage E of the static field being measured. The wave-form of the output current shown in FIG. 5 is generated in each sensing plate A and B as the blade C rotates and is unique to the shape of the sensing plates A and B. The position of the envelope or peak relative to a zero reference or zero axis will indicate the polarity information of the dissymmetry of the wave-form. The output signal from the difference amplifier 17 is the same shape as the wave-form shown in FIG. 5 since the two output currents in the two capacitors CA and CB are the exact inverse and the difference amplifier adds them together. The wave-form shown resembles a full wave rectified sine wave where the peaks indicate the polarity of the electrostatic field. There is a major peak of 1.2 and a minor peak of 0.6 with the area under the envelopes being the same. The current is in amps times $10^{-7}$.

It is seen from FIG. 4 that the capacitances of the two capacitors designated CA and CB vary inversely and are always opposite to the other and so the circuit to which they are connected is a balanced circuit.

As a result of the changes in capacitances CA and CB as above described in the circuit, an output current wave-form shown in FIG. 5 is generated in each sensing plate A and B. This wave-form is a plot of the angular position of the blade C using the 0° reference as above designated along the X axis and the output current along the Y axis. At 0° there is a current of about −9.5 which then peaks at −0.6 and then reverses to a position peak of +1.2 at an angular position of 90° and back to about −0.5 at 180° for a full cycle which repeats for the movement of the blade between 180° and 360°. Two similar repetitive, non-symmetrical wave-forms are generated for each revolution of 360° for the blade.

The polarity information is indicated by the non-symmetry of the wave-form about its zero axis. When the field is positive the peak of greatest amplitude of the wave-form is above the zero axis or zero reference. When the field is negative the peak of greatest amplitude is below the zero reference. The slight decrease in amplitude of the peak of lesser amplitude and the greater width which makes a "saddle" shape is due to the non-linearity of the plates and serves to further distinguish the two half-cycle peaks.

There is instantaneous current flowing first in one direction through one half of the resistor 16 and then in an opposite direction. The output signal across resistor 16 is then applied to a difference amplifier 17 which in effect adds the difference of the two, providing a composite output signal. The saddle portion on each side of the zero reference or 180° reference represents some third harmonic resulting from the non-linear change of capacitance due to the non-linear shape of the plates.

Figure 6:
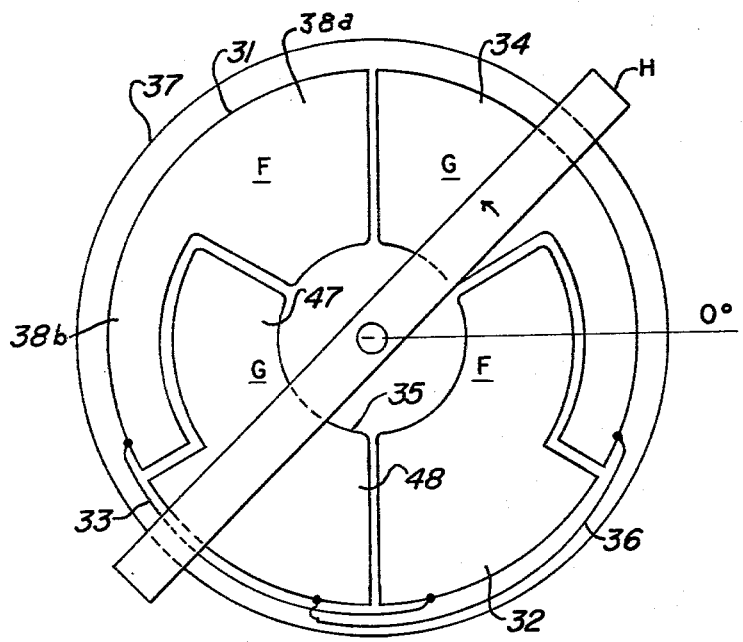
FIG. 6 is a side elevation view of another form of sensor having two plates, with two opposed plate segments.
Figure 7:
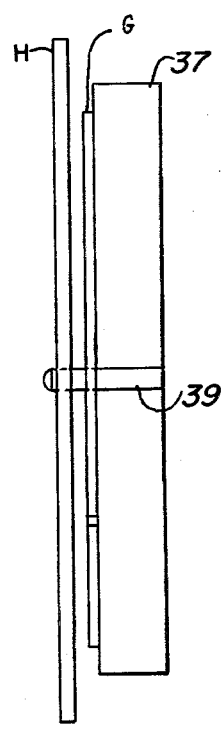
FIG. 7 is an end elevation view of the sensor shown in FIG. 6.

Referring now to FIGS. 6 and 7, there is shown another form of sensor having a sensing plate F comprised of plate segments 31 and 32 located at diametrically opposite positions that are electrically connected together by an electric line 33 and a sensing plate G comprised of two plate segments 34 and 35 located at diametrically opposite positions that are electrically connected together by an electric line 36. These two plates F and G are mounted on a flat face of a common dielectric substrate 37. A blade H is mounted for rotation on a shaft 39. Blade segments 31 and 33 are opposite, symmetrical, and reversely arranged relative to a circular path having a common center at the axis of rotation. In turn, blade segments 32 and 34 are opposite, symmetrical and reversely arranged. Plates F and G as well as plates A and B are a relatively thin coating of metal on the substrate, as on the order of two mil.

Segment 31 has a wider end that gradually decreases in width toward a narrower end and includes a wider end portion 38a with a center line formed along one radius and a narrower end portion 38b formed along another larger radius so as to provide a stepped shape and yet decreasing width from the wider end to the narrower end portion 47 opposite portion 37, completing a semicircular segment of the plate shapes. In the embodiment shown in FIG. 6, preferably a ground ring is used around the outside of the sensing plates F and G to prevent current leakage.

Again, for reference purposes the 0° reference point for the blade 38 is taken along the X axis of an X-Y coordinate system and in this position the blade covers an equal area of the two plates F and G. When passed through an angular movement of 45°, more of plate D is exposed so the capacitance between plate F and a charged surface area 12 designated CF increases, and less of plate G is exposed so the capacitance between plate G and the charged surface area 12 designated CG decreases. As the blade proceeds past 90° the leading half portion of the blade H covers a maximum part of plate G and CF has a sharp decrease while at the same time the trailing half portion of the blade covers a minimum area of plate G for a maximum CG.

Figure 8:
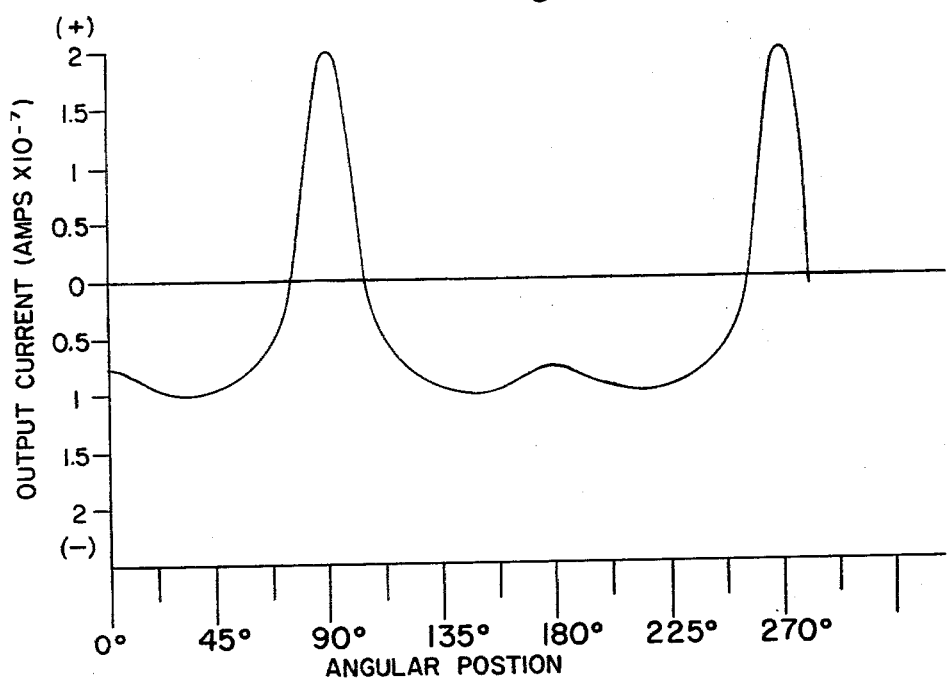
FIG. 8 is a wave-form showing the output current wave-form in relation to angular position for the sensor of FIG. 6.

The wave-form shown in FIG. 8, which is a plot of the angular position of blade H using the 0° reference as indicated along an X-axis and the output current along the Y-axis, shows about −0.75 as 0° and then peaks at −1.0 and reverses to a positive peak of +2.0 at an angular position of 90° and back to −0.75 at 180° for a full cycle which repeats for the movement of the blade between 180° and 360°. Again, as with the wave-form of FIG. 5, two similar, repetitive, non-symmetrical output current wave-forms are generated for each of 360° for the blade.

Figure 9:
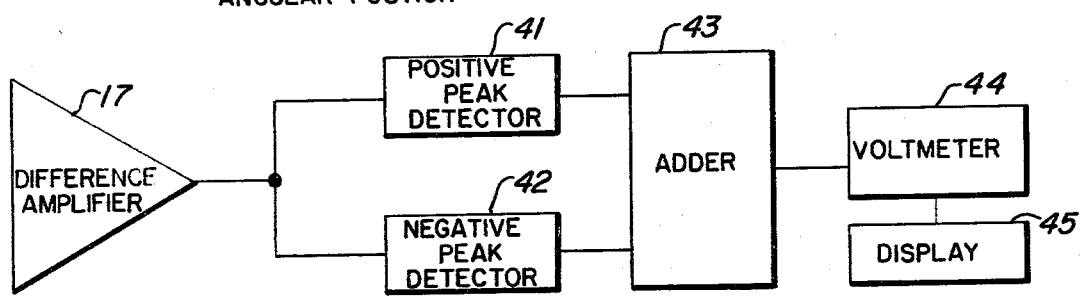
FIG. 9 is a schematic diagram showing one form of output circuit providing a visual display of the measurement of intensity and polarity.

Referring now to FIGS. 9–12, there are illustrated in schematic block diagram form several output circuits to which the output from difference amplifier 17, above described, may be advantageously applied. In FIG. 9 the output of the amplifier 18 is coupled to the input of a positive peak detector 41 and to the input of a negative peak detector 42 with the outputs of these detectors being coupled to the input of an adder 43 having an output applied to the input of a voltmeter 44 with a visual digital display 45 for indicating both the polarity and amplitude of the measured field.

Figure 10:
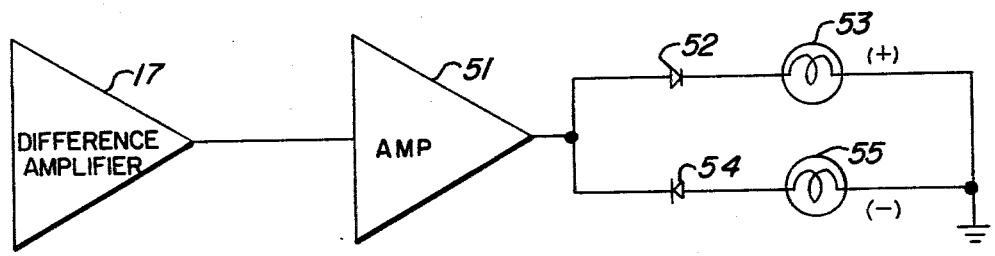
FIG. 10 is a schematic diagram showing another output circuit using lamps.

The output circuit shown in FIG. 10 has the output of the difference amplifier 17 further amplified by an amplifier stage and one-half the cycle is passed via a rectifier 52 connected for current flow in one direction to light a lamp 53, indicating the measured field is positive, and the other half cycle is passed via a rectifier 54 connected for current flow opposite to that of rectifier 52 to light a lamp 55, indicating the field is negative.

Figure 11:
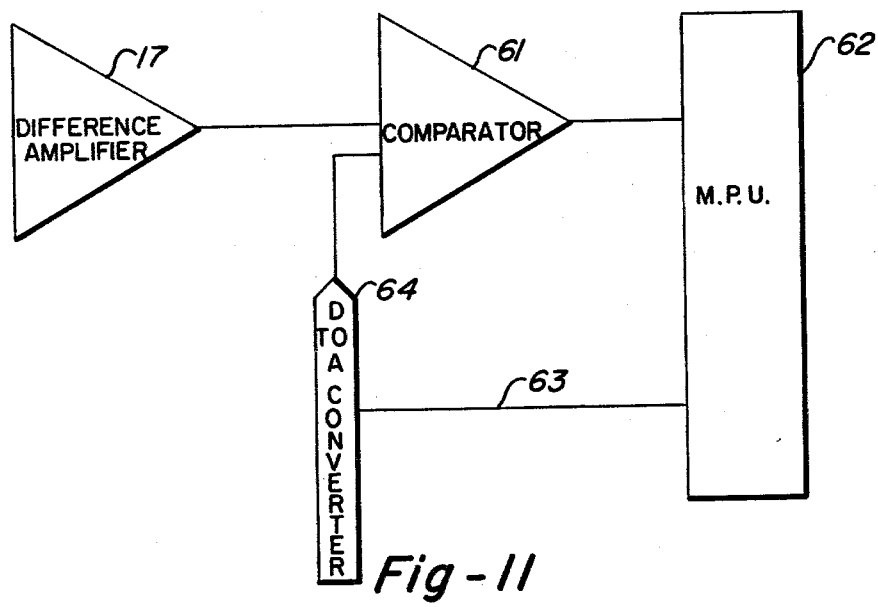
FIG. 11 is a schematic diagram showing another form of output circuit using a microprocessor.

In a more sophisticated output circuit shown in FIG. 11, the output of the difference amplifier 17 is connected to one input of a comparator 61 which in turn has its output connected to a microprocessing unit 62. A plurality of output lines 63 are coupled from the microprocessing unit into a digital-to-analog computer 64 having an output coupled to another input of the comparator 61.

Figure 12:
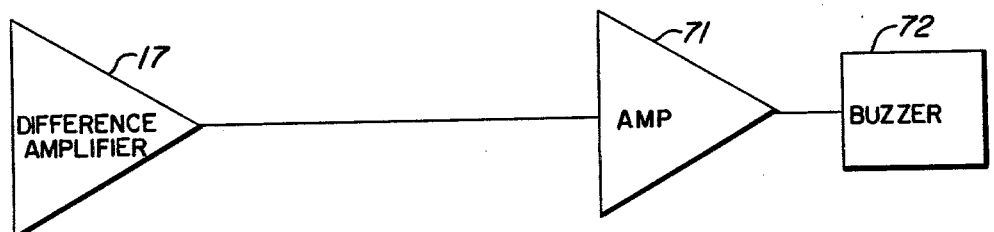
FIG. 12 is yet another usable form of output circuit using a buzzer.

Finally, a relatively simple output circuit shown in FIG. 12 would comprise an amplifier 71 for amplifying the output signal from the difference amplifier 17, which in turn activates a buzzer 72, indicating an electrostatic field is present.

Although the present invention has been described with a certain degree of particularity, it is understood that the present disclosure has been made by way of example and that changes in details of structure may be made without departing from the spirit thereof.

What is claimed is:

1. In apparatus for detecting and measuring an electrostatic field, the combination comprising:
   sensing means including first and second sensing plates; and
   a rotary blade mounted for moving over said plates so as to vary the area of the plates exposed to an electrostatic field being measured, said sensing plates being shaped with a selected non-linear varying width and reversely arranged relative to one another for producing an electric output signal having a repetitive, non-symmetrical wave-form with a dissimilarity of shape and a reversal of position in each half-cycle with respect to a reference that indicates the polarity and the intensity of the measured electrostatic field.

2. In apparatus as set forth in claim 1 wherein said sensing plates are reversely arranged along a circular path having a common center and shaped to have an inversely related area at diametrically opposite positions relative to said common center.

3. In apparatus as set forth in claim 2 wherein each of said sensing plates includes two separate plate segments located at diametrically opposite positions with respect to said common center, each of said segments being electrically connected to one another.

4. In apparatus as set forth in claim 3 wherein each of said plate segments has a wider end portion formed along one radius with respect to said common center and a narrower end portion formed along another radius with respect to said common center.

5. In apparatus as set forth in claim 1 wherein said plates are reversely arranged along a circular path whereby a blade of uniform width and symmetrical about its axis of rotation alternately covers and uncovers said plates in an inverse relationship for each half revolution of the blade.

6. In apparatus as defined in claim 1 wherein said first sensing plate forms with a charged surface area producing the electrostatic field a first capacitor having a first capacitance and said second sensing plate forms with said charged surface area a second capacitor having a second capacitance, said sensing plates and blade being arranged so that said first and second capacitances vary inversely in relation to one another and with a non-linear change of capacitances as said blade is rotated.

7. In apparatus as defined in claim 1 wherein said blade has symmetrical half portions on opposite sides of its axis of rotation.

8. In apparatus as defined in claim 7 wherein said half portions are symmetrical and have a uniform width.

9. In apparatus as defined in claim 1 wherein said first and second plates are symmetrical and have a corresponding size and shape, and each said plate has a wider end and decreases in width along its side edges to a narrower end to vary the surface area exposed upon the rotation of the blade thereover.

10. In apparatus as defined in claim 9 wherein the wider ends of said plates are opposite one another and the narrower ends of said plates are opposite one another.

11. In apparatus as defined in claim 9 wherein the shape of each of said plates includes an inwardly tapered end portion adjacent the wider end, an intermediate portion of uniform width and a tapered end portion that narrows toward said narrow end providing a third harmonic effect in one half-cycle of the wave-form generated.

12. In apparatus as defined in claim 1 wherein said plates and blade are shaped and arranged to provide a wave-form with one envelope for one half cycle of one polarity having an amplitude that is approximately twice the amplitude of the envelope of the other half-cycle of the opposite polarity.

13. In apparatus as defined in claim 1 wherein the relationship of the two half-cycles of the wave-form relative to a zero reference is non-symmetrical.

14. In apparatus as defined in claim 1 wherein a half portion of said blade moves from a wider end toward a narrower end of one of said plates while at the same time another half portion of said blade moves from a narrower end toward a wider end of the other of said plates.

15. In apparatus as defined in claim 1 including a resistor across said plates, said resistor having a center tap connected to ground and the end terminals of the resistor connected to the input of a difference amplifier.

16. In apparatus as defined in claim 13 including an output circuit coupled to the output of said difference amplifier providing an indication of the intensity and polarity of the measured electrostatic field.

17. Apparatus for detecting and measuring an electrostatic field comprising:
a sensor including opposed, first and second symmetrical sensing plates reversely arranged along a circumferential path having a common center and shaped to have an inversely related area at diametrically opposite positions relative to said common center;
a rotary blade mounted for rotation between said sensing plates having opposed portions on opposite sides of its axis of rotation moving over said plates to vary the surface area exposed to an electrostatic field being measured, said sensing plates and blade shaped and arranged relative to one another with said sensing plates having a selected non-linear width configuration to produce a distinctive wave-form, whereby upon rotation of said rotary blade an instantaneous current is caused to flow in said plates for producing an output signal having a repetitive, non-symmetrical wave-form with a reversal of position relative to a zero reference in each half-cycle so that the position of the wave-form of each half-cycle is a measure of polarity and the amplitude of the wave-form is a measure of field intensity;
a load resistor connected across said sensing plates having a center tap connected to ground;
a difference amplifier coupled across said load resistor providing an output signal that is a composite of the current caused to flow in said plates; and
an output circuit coupled to the output of said difference amplifier including an indicator device for indicating the polarity and intensity of the measured field.

18. Apparatus as set forth in claim 17 wherein said plates are mounted on a non-conductive substrate with a shaft for the rotary blade mounted thereon, said sensing plates being coplanar.

19. Apparatus as set forth in claim 17 wherein said output circuit includes negative and positive peak detectors coupled to the output of said difference amplifier, and an adder adding the outputs of said detectors and applying an output to a voltmeter with a display.

20. Apparatus as set forth in claim 17 wherein said output circuit includes an amplifier amplifying the output of said difference amplifier and a lamp for indicating each polarity.

21. Apparatus as set forth in claim 17 wherein the output of said difference amplifier is amplified and applied to a sound device.

22. Apparatus as set forth in claim 17 wherein the output of said difference amplifier is applied as an input to a comparator which in turn operates a microprocessor unit with an output of the microprocessor being applied to a digital-to-analog converter providing an input to said comparator.

* * * * *